United States Patent [19]

Kitamura

[11] Patent Number: 4,954,784
[45] Date of Patent: Sep. 4, 1990

[54] PHASE ADJUSTMENT CIRCUIT

[75] Inventor: Tsutomu Kitamura, Tokyo, Japan

[73] Assignee: Matsushita Electric Industrial Co., Ltd., Osaka, Japan

[21] Appl. No.: 381,641

[22] PCT Filed: Nov. 14, 1988

[86] PCT No.: PCT/JP88/01146

§ 371 Date: Jul. 7, 1989

§ 102(e) Date: Jul. 7, 1989

[87] PCT Pub. No.: WO89/05081

PCT Pub. Date: Jun. 1, 1989

[30] Foreign Application Priority Data

Nov. 16, 1987 [JP] Japan .................. 62-288770

[51] Int. Cl.$^5$ .................. H03K 5/13; H03K 5/159
[52] U.S. Cl. .................. 328/155; 328/55; 307/262; 307/273; 307/608
[58] Field of Search .................. 328/155, 55, 139; 307/593, 608, 262, 273, 511

[56] References Cited

U.S. PATENT DOCUMENTS 4,003,078 1/1977 Owen .................. 307/262
4,187,439 2/1980 Vesel .................. 307/273
4,746,819 5/1988 Kashiwagi .................. 328/55

FOREIGN PATENT DOCUMENTS 49-40263 11/1974 Japan .
61-134795 6/1986 Japan .
61-143186 9/1986 Japan .
62-77766 4/1987 Japan .

Primary Examiner—Timothy P. Callahan
Attorney, Agent, or Firm—Stevens, Davis, Miller & Mosher

[57] ABSTRACT

A phase adjustment circuit for display apparatuses operates to vary the phase of an input sync signal to produce a pseudo sync signal for use in positioning an image at the center of a display screen. The circuit comprises a voltage comparator (50) having two input terminals thereto maintained at the same d.c. voltage, and one input terminal thereto is supplied through a d.c. blocking capacitor ($C_2$) with a saw-tooth wave signal ($P_1$) obtained by integrating the input sync signal, whereby a pulse having an edge of its pulse waveform situated always at the midpoint position between the two input sync signals. Pseudo sync signal generation means (101, 102) are triggered by the edge of the pulse waveform so that the pseudo sync signal of a phase different from that of the input sync signal is formed.

2 Claims, 2 Drawing Sheets

PHASE ADJUSTMENT CIRCUIT

TECHNICAL FIELD

This invention relates to a phase adjustment circuit to be used for the phase adjustment between the synchronizing (sync) signal and video signal in a cathode ray tube (CRT) display apparatus.

BACKGROUND ART

The horizontal sync signal applied to the CRT display apparatus varies widely depending on an image to be displayed on a display screen, and it does not have a standardized phase relation with the video signal. As a result, the image position on the display screen varies depending on the frequency of an applied horizontal sync signal, and hence in order to display an image at the center of the display screen for any video signals of different phase relations, the CRT display apparatuses are equipped with a phase adjustment circuit for adjusting the image position on the display screen.

Conventionally, a phase adjustment circuit as shown in FIG. 4, for example, has been used. This conventional phase adjustment circuit comprises a first monostable multivibrator (hereinafter abbreviated as MM) 101 which is triggered by a rising edge of an input sync signal B and produces a pulse signal having a pulse width of $\tau_{101}$ so that the input sync signal B is delayed by a desired delay time, and a second monostable multivibrator (hereinafter abbreviated as MM) 102 which is triggered by a falling edge of an output pulse signal of the MM 101 and produces a pseudo sync signal having the same pulse width as that of the input sync signal B. Though it has not been illustrated, both the MM 101 and 102 have a known circuit arrangement for setting the output pulse width by using a time constant determined by a capacitor C and a resistor R, and specifically the MM 101 uses a variable resistor so that its time constant may be varied.

The operation of the conventional phase adjustment circuit using the MM 101 and 102 will be explained with reference to FIG. 5. Shown at (A) in FIG. 5 is a video signal applied to a CRT monitor display, and shown at (B) therein is a sync signal. When triggered by an edge (a rising edge in the case shown at (B) in FIG. 5) of the sync signal B, the MM 101 produces an output as shown at (C) in FIG. 5. The falling edge of the output (C) is used to trigger the MM 102, which then produces a pulse output (D) delayed by $\Delta t$ equal to the output pulse width $\tau_{101}$ of the MM 101, and the pulse D is used as a pseudo sync signal for effecting the adjustment of the image position on the display screen. However, the MM 101 and 102 are both basically delay circuits, so that they provide an adjustable range only on the delay side, and therefore there is a disadvantage that the image position can merely be moved in one direction on the screen.

In order to overcome this disadvantage, there is a method of producing a pseudo sync signal having an equivalent leading phase by making the pulse width $\tau_{101}$ of the output pulse of the MM 101 nearly as wide as the period T by utilizing repetitive generation of the sync signal at the constant period T.

However, there is a problem such that, in this method, an output waveform of a charge/discharge circuit of the MM 101 formed by a capacitor and a resistor has a gentle slope, so that the level of the output waveform varies near a threshold level for triggering a switching element for a relatively long period, which gives rise to a false operation of readily exceeding the threshold level upon mixing-in of noises, resulting in a failure in obtaining an output signal having a desired pulse width.

Then, there is conceived a method of making an output waveform of the charge/discharge circuit have a relatively steep slope by additionally disposing a new monostable multivibrator, which is triggered by a rising edge of the sync signal, for example, and outputs a pulse having a pulse width equal to one half period of the sync signal, at the preceding stage of the MM 101 and 102, thereby reducing a delay caused by the MM 101.

However, as is well known, a monostable multivibrator is formed by a combination of switching elements, e.g. transistors, capacitors and resistors, for example, and its output pulse width cannot be constant due to dispersion of characteristics of these component parts. In addition, the input/output characteristics of the switching elements vary depending on the frequency, amplitude, etc. of the applied sync signal and also vary depending on the temperature. As a result, it is not possible to assure a stable half-period pulse width for an input sync signal of any arbitrary frequency irrespective of temperature changes, etc.

Accordingly, the present invention is intended to overcome the foregoing prior art problems, and it is an object of the present invention to provide a phase adjustment circuit capable of making stable adjustment of the image position on the display screen still with a simple structure.

DISCLOSURE OF THE INVENTION

In order to achieve the above object, the phase adjustment circuit of this invention is characterized by comprising an integration circuit for integrating an input sync signal, a d.c. blocking capacitor having one end thereof connected to an output side of the integration circuit, a voltage comparator having both first and second input terminals thereof connected to the same reference d.c. voltage source and having the first or second input terminal connected to the other end of the d.c. blocking capacitor and outputting a pulse signal having a pulse width substantially equal to one half period of the sync signal, and a delay circuit which is triggered by the output pulse signal from the voltage comparator to produce a pseudo sync signal having the same pulse width as that of the input sync signal.

With the above-described structure, a rectangular wave is produced by detecting a mean value of a sawtooth wave which is an integration output, so that the rectangular wave stably shifted by one half period can be obtained without being affected by the period and pulse width of an applied sync signal or the temperature. Then, the phase adjustment circuit is so constructed as to input the rectangular wave to the delay circuit formed of a monostable multivibrator as a second reference signal. Thus, it is possible to ensure a required phase adjustment quantity as a whole, even when the latter-stage delay circuit provides a small amount of delay, and besides it is possible to form a pseudo sync signal having an arbitrary phase relation to the first input sync signal, which provides the first reference in respect of both phases of lead and lag, without causing any mulfunction to be caused by noises or the like.

BEST MODE FOR CARRYING OUT THE INVENTION

Figure 1:
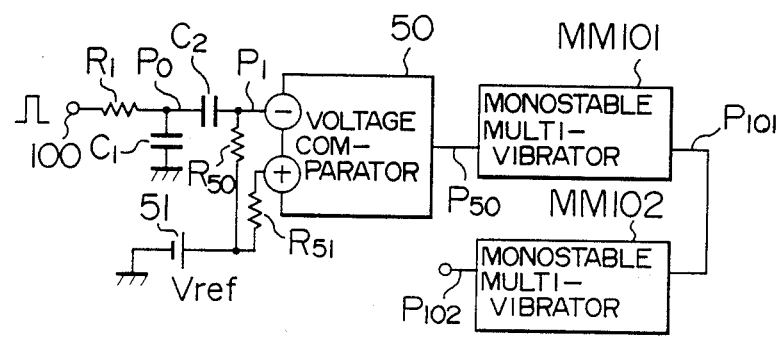
FIG. 1 is a circuit diagram inclusive of a block diagram showing the phase adjustment circuit of an embodiment of this invention.

An explanation will be made of the phase adjustment circuit of an embodiment of the present invention with reference to the drawings. FIG. 1 is a circuit diagram inclusive of a block diagram showing the phase adjustment circuit of an embodiment of this invention, and FIG. 2 is a timing chart for explaining the operation of this phase adjustment circuit.

In FIG. 1, an inverting input terminal (negative terminal) and a noninverting input terminal (positive terminal) of a voltage comparator 50 are supplied with the same d.c. voltage $V_{ref}$ from a d.c. voltage source 51 through resistors $R_{50}$ and $R_{51}$, and an integration circuit made up of a resistor $R_1$ and a capacitor $C_1$ is connected through a d.c. blocking capacitor $C_2$ between the negative input terminal of the voltage comparator 50 and an input terminal 100. The output signal $P_{50}$ of the voltage comparator 50 is applied to a delay circuit made up of a series connection of first and second monostable multivibrators 101 and 102 of the structure similar to that of a conventional phase adjustment circuit.

Figure 2:
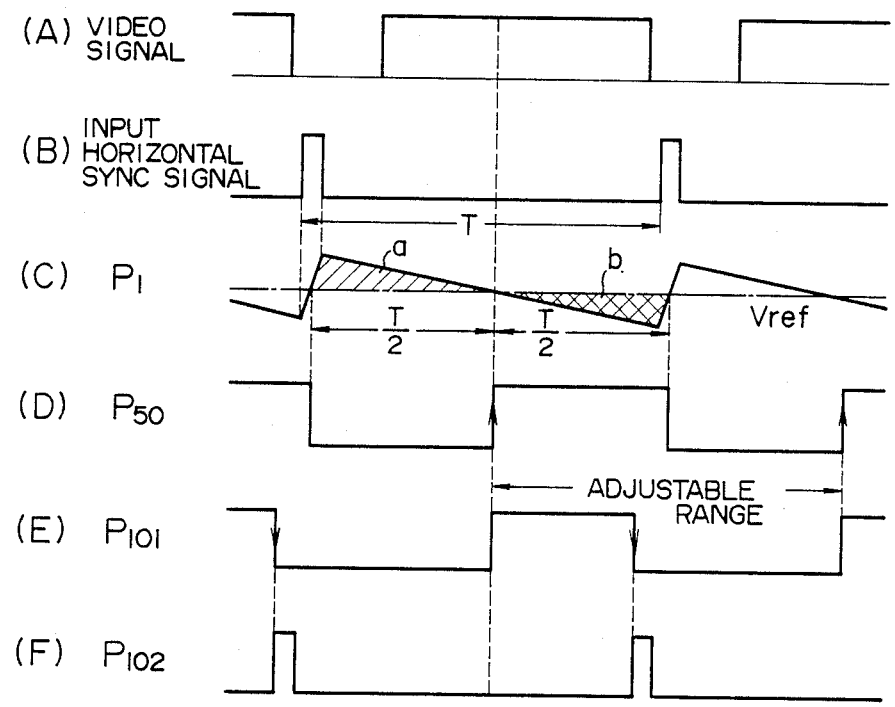
FIG. 2(a–f) is a timing chart for explaining the operation of the phase adjustment circuit of the embodiment of this invention.

In this circuit arrangement, when a horizontal sync signal (shown at (B) in FIG. 2) is applied to the integration circuit $R_1$ and $C_1$, it produces at its output $P_0$ an integrated waveform of a saw-tooth wave. The saw-tooth wave has a period equal to the period T of the applied sync signal B. Then, the saw-tooth wave C is fed through a capacitor $C_2$ to the negative input terminal of the voltage comparator 50, and, since its d.c. component is blocked by the capacitor $C_2$, it is turned to have a symmetrical waveform with respect to the voltage $V_{ref}$ as shown at (C) in FIG. 2. Namely, the waveform has equal areas shown by hatched portions a and b in FIG. 2, and it becomes symmetric with respect to the mean value of the saw-tooth wave. The time when the saw-tooth wave crosses the voltage $V_{ref}$ is T/2. Since the constant voltage $V_{ref}$ is applied to the other positive input terminal of the voltage comparator 50, a rectangular wave P50 of a 50% duty cycle as shown at (D) in FIG. 2 is obtained at the output of the voltage comparator 50. The output signal waveform of the voltage comparator 50 is inverted substantially at the midpoint between two applied sync signals.

Figure 3:
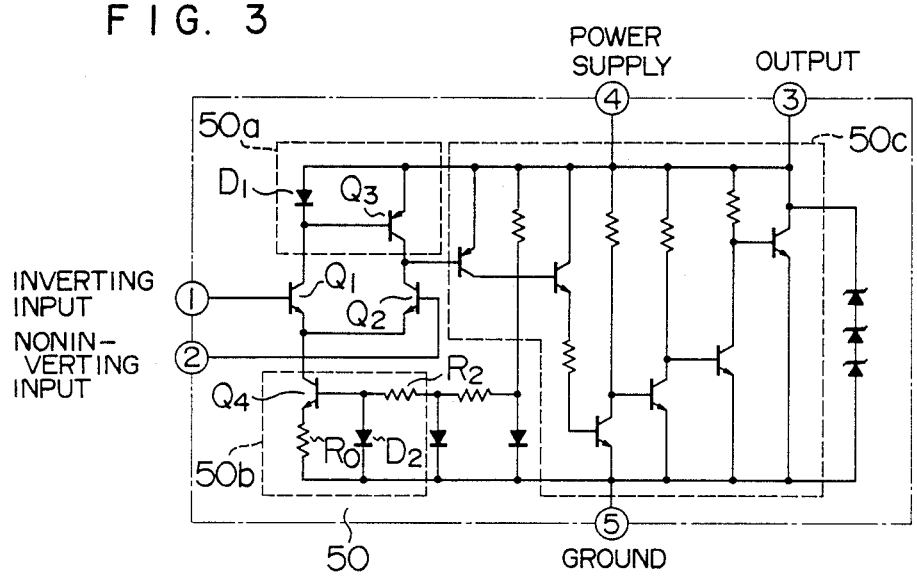
FIG. 3 is a circuit diagram showing the structure of the comparator in the phase adjustment circuit of an embodiment of this invention.
Figure 4:
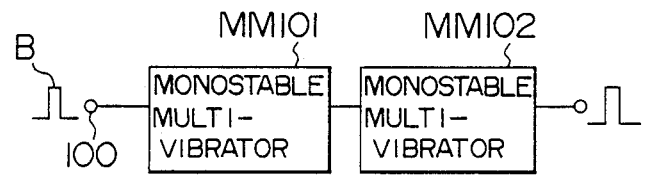
FIG. 4 is a block diagram showing a conventional phase adjustment circuit.
Figure 5:
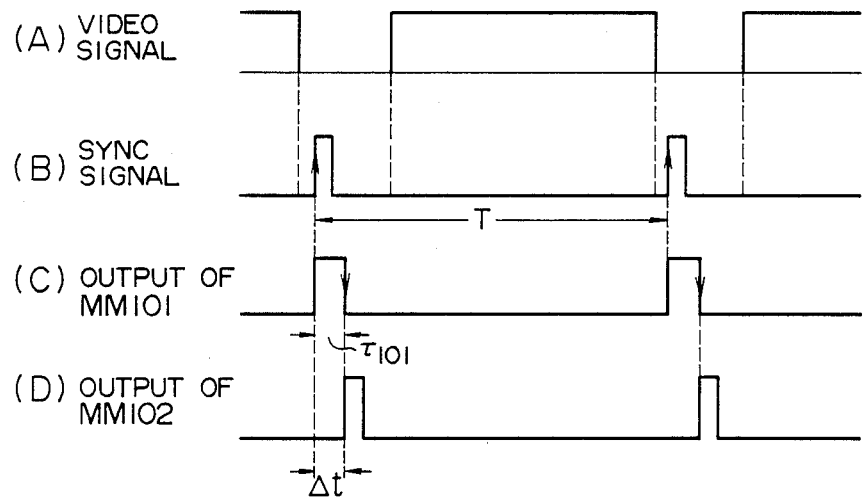
FIG. 5(a–d) is a timing chart for explaining the operation of a conventional phase adjustment circuit.

The voltage comparator 50 is preferably formed of a differential amplifier, and it has such a structure as shown in FIG. 3. The voltage comparator shown in FIG. 3 comprises two transistors $Q_1$ and $Q_2$ having their bases connected to the inverting input and the noninverting input, respectively, a constant current source 50a formed of a diode $D_1$ and a transistor $Q_3$, a constant current source 50b formed of a diode $D_2$, transistor $Q_4$ and resistors $R_0$ and $R_2$, and a buffer amplifier 50c.

As the differential voltage comparator 50, such an alternative one as described in JP-Y-49-40263 (Japanese Utility Model Post-exam. Publication No. 49-40263) may be used.

The comparator output P50 is inputted to the MM 101. Each of the MM 101 and MM 102 comprises a time-constant forming circuit made up of switching elements such as well-known transistors, capacitors and resistors, similarly to a conventional one, wherein the MM 101 uses a variable resistor as a resistor for forming the time-constant circuit so that the time constant is made adjustable, while, the MM 102 is arranged so that its output pulse width becomes equal to the pulse width of the input sync signal. The MM 101 is triggered by a rising edge of the comparator output P50 having a pulse width equal to one half period of the input sync signal (shown at (B) in FIG. 2), and it outputs a pulse P101 having a pulse width determined depending on an external adjustment amount of the time constant (shown at (E) in FIG. 2). The pulse P101 is inputted to the MM 102, and the latter is triggered by a falling edge of this pulse P101 and produces a pseudo sync signal P102 having the same pulse width as that of the input sync signal (shown at (F) in FIG. 2). The pseudo sync signal produced by the MM 102 is outputted within the duration of one period which elapses from the time point one half period after the time point of generation of the input sync signal which gives the time point reference. Accordingly, if this pseudo sync signal is utilized for the input sync signal one period after the time point reference input sync signal, it becomes possible to adjust the phase over one half period in both leading and lagging directions from the time point of the latter input sync signal.

As described, in accordance with this invention, a rectangular wave is formed by detecting a mean value of a saw-tooth wave which is produced by the integration circuit in response to a sync signal inputted thereto, so that it is possible to surely obtain a rectangular wave having a pulse width of one half period and a 50% duty cycle, without being affected by the period and pulse width of an applied sync signal and also by the ambient temperature. By using, as a reference, the voltage comparator output having a pulse width of one half of the period of the input sync signal, a pseudo sync signal is formed through the delay circuit employing a monostable multivibrator. Therefore, even when the mixing-in of noises should occur in the monostable multivibrator, a relatively steep slope of the charge/discharge waveform of the time-constant circuit of the monostable multivibrator assures the circuit of this invention to be immune to malfunction, particularly when phase adjustment is performed to advance the phase equivalently. In consequence, the present invention makes it possible particularly to perform phase advancing adjustment stably without causing any malfunction.

INDUSTRIAL APPLICABILITY

The phase adjustment circuit of this invention makes it possible for a CRT display apparatus, to which a sync signal having no specified phase relation to a video signal is supplied, to produce an equivalent leading or lagging sync signal, without being affected by the period of the input sync signal and temperature variations.

What is claimed is:

1. A phase adjustment circuit comprising: an input terminal for inputting a synchronizing signal thereto; an integration circuit having an input side thereof connected to said input terminal; a d.c. blocking capacitor having one end thereof connected to an output side of said integration circuit; a voltage comparator having both first and second input terminals thereof connected to the same reference d.c. voltage source through respective resistors and having one of said first and second input terminals connected to the other end of said d.c. blocking capacitor and producing an output pulse signal having a pulse width substantially equal to one half period of the synchronizing signal; and a delay circuit which is triggered by the output pulse signal from said voltage comparator to produce a pseudo synchronizing signal.

2. A phase adjustment circuit comprising: an input terminal for inputting a synchronizing signal thereto; an integration circuit having an input side thereof connected to said input terminal; a d.c. blocking capacitor having one end thereof connected to an output side of said integration circuit; a differential voltage comparator having an inverting input terminal thereof connected to the other end of said d.c. blocking capacitor; a reference d.c. voltage source connected to said inverting input terminal and a noninverting input terminal of said differential voltage comparator through respective resistors; a first monostable multivibrator whose input is connected to an output of said differential voltage comparator and which is triggered by an output signal from said differential voltage comparator to produce an output pulse having a pulse width which can be set desirably; and a second monostable multivibrator which is triggered by an output pulse of said first monostable multivibrator to output a pseudo synchronizing signal having a pulse width equal to that of the synchronizing signal.

* * * * *